United States Patent
Funahashi et al.

[11] Patent Number: 5,846,910
[45] Date of Patent: Dec. 8, 1998

[54] METHOD FOR PRODUCTION OF $B_I$-2212 SUPERCONDUCTING TAPE MATERIAL

[75] Inventors: Ryoji Funahashi, Kobe; Ichiro Matsubara, Minoo; Kazuo Ueno; Hiroshi Ishikawa, both of Ikeda, all of Japan

[73] Assignee: Agency of Industrial Science & Technology, Ministry of International Trade & Industry, Tokyo, Japan

[21] Appl. No.: 873,090

[22] Filed: Jun. 11, 1997

[30] Foreign Application Priority Data

Jun. 14, 1996 [JP] Japan .................................. 8-175827

[51] Int. Cl.$^6$ .................................................. H01L 39/24
[52] U.S. Cl. ......................... 505/430; 505/450; 505/501; 505/230; 505/733; 427/62
[58] Field of Search ..................................... 505/430, 450, 505/501, 230, 733; 427/62; 174/125.1

[56] References Cited

U.S. PATENT DOCUMENTS 5,242,896  9/1993  Matsubara et al. .
5,354,921  10/1994  Matsubara et al. .

OTHER PUBLICATIONS

MacManus et al, Appl. Phys. Lett. 65(22), Nov. 1994, pp. 2872–2874.

T.G. Holesinger, et al., "Isothermal Melt Processing of Bi–2212 Thick Films", Physica C 243, (1995), pp. 93–102.

T.G. Holesinger, et al., "Directional Isothermal Growth of Highly Textured $bi_2Sr_2CaCu_2O_y$,", Appl. Phys. Lett., vol. 63, No. 7, Aug. 16, 1993, pp. 982–984.

R.D. Ray II, et al., "Synthesis of Ag Sheathed, Bi–2212 Tapes by a Novel Liquid Wicking Method", Physica C 251, (1995), pp. 1–6.

Ryoji Funahashi, et al., "Critical Current Density for $Bi_2Sr_2CaCu_2O_x$/Ag Tapes Prepared Using an Isothermal Partial Melting Method Under Controlled Atmospheres", Physica C 273, (1997), pp. 337–341.

*Primary Examiner*—Roy V. King
*Attorney, Agent, or Firm*—Oblon, Spivak, McClelland. Maier & Neustadt, P.C.

[57] ABSTRACT

This invention concerns a method for the production of an oxide superconducting tape material having a composition of $Bi_2Sr_2CaCu_2O_8$, which method consists essentially of forming a sandwich structure comprising a layer formed of a superconducting powder consisting essentially of Bi, Sr, Ca, Cu, and O and having an essential structure of $Bi_2Sr_2CaCu_2O_8$ and silver sheet layers, the superconducting powder layer being interposed between the silver sheet layers, heating the sandwich structure at a temperature in the range of 810°–910° C. in an atmosphere consisting of oxygen and an inert gas and having an oxygen partial pressure in the range of 0–90%, thereby melting the superconducting powder layer, and then elevating the oxygen partial pressure of the atmosphere while retaining the same heating temperature, thereby crystallizing the molten superconducting powder layer.

4 Claims, 10 Drawing Sheets

METHOD FOR PRODUCTION OF $B_i$-2212 SUPERCONDUCTING TAPE MATERIAL

BACKGROUND OF THE INVENTION

1. Field of the Invention:

This invention relates to a method for the production of a superconducting tape material.

2. Description of the Prior Art:

In recent years, research on oxide superconducting substances has advanced markedly in both the basic and applied fields. The basic field has seen the discovery of numerous new superconducting substances and methods of synthesis, and the publication of many papers on the mechanism of superconductibity. In the applied field, research has expanded to applications ranging from electric and electronic materials to medical equipment. In various fields, expectations for the development of oxide superconducting materials and the improvement of their functions are high.

The superconducting materials in extensive use today are non-oxide superconducting materials such as niobium.titanium alloys. These superconducting materials are being used for example, to manufacture superconducting magnets with magnetic flux density of more than 15 teslas. Since these superconducting substances have low critical temperatures, they must be cooled with liquid helium and are therefore expensive to use. They also have low critical magnetic fields. Thus, non-oxide superconducting magnets with a magnetic flux density of more than 20 teslas are not manufactured. Magnets which generate magnetic fields exceeding 20 teslas are required to improve the resolving power of nuclear magnetic resonance measuring devices (NMR) for chemical analysis and magnetic resonance image diagnosing devices (MRI) for medical examination, improved beyond the present specified levels. The superconducting materials for use in such superconducting magnets must have a high critical current density (not less than $10^5$ A/cm$^2$) and also a high critical magnetic field (not less than 30 teslas).

The low critical temperature and critical magnetic field of the non-oxide superconducting materials causes problems in practical utility. In contrast, the oxide superconducting substances are low in cooling cost because they have high critical temperatures and high critical magnetic fields. As a result, they are expected to be applied not only to superconducting magnets capable of generating high magnetic fields but also to superconducting cables for transmitting large electric currents and current leads for feeding electric current to superconducting magnets. The oxide superconducting substances must be made into wire and tape materials for such applications.

At present, oxide superconducting substances are formed into wire and tape materials by the cladding with a metal (chiefly silver). Since the oxide superconducting materials manufactured as wire or tape materials are polycrystalline substances, the superconducting coupling at the grain boundary is cited as one of the factors which decide their superconducting properties (critical temperature, critical current density, and the like). Superconducting materials with weak superconducting coupling are inevitably poor in superconducting properties. The method of melting the raw material powder for a superconducting material and then gradually cooling the molten raw material to crystallize it (hereinafter referred to as "melting-slow cooling method") is known as an effective way of manufacturing a wire or tape material with strong superconducting coupling between crystal grains.

However, the conventional melting-slow cooling method has a serious problem. The oxide superconducting material is a decomposing and melting type, incongruent compound. When it is melted, therefore, it forms a liquid phase and a solid phase which are different from the superconducting phase of the raw material. The crystallization which is induced by the subsequent slow cooling proceeds through a peritectic reaction. To react the liquid phase with the solid phase completely, therefore, the two phases must be retained at the temperature for forming a superconducting substance for a long time. The problem of the melting-slow cooling-crystallizing method is that the inner temperature of the furnace falls below the temperature for the formation of superconducting crystals before the reaction between the liquid phase and the solid phase is completed and, as a result, an impurity phase persists in the product of the reaction and degrades the superconducting properties of the product.

The wire material manufactured by the melting-slow cooling-crystallizing method has the superconducting substance part thereof completely covered with a silver tube (hereinafter referred to as "silver-sheathed wire material"). It therefore has the problem that when the wire material is fired, the silver coating bursts, swells, deformats, etc. owing to gases emanating from the superconducting substance and the organic binder. A tape material, which has only one of the opposite surfaces thereof covered with silver, does not incur the deformation which would otherwise arise owing to the gases released during firing. Since the superconducting substance thereof is directly exposed to the open air over a large area, however, the firing makes the composition and crystal grain size at the interface between the silver and the superconducting substance different from those at the surface of the superconducting substance not covered with silver. The degraded uniformity of material degrades the superconducting properties and makes control of the superconducting properties difficult.

For application to superconducting switches, superconducting fuses, and superconducting sensors which utilize the superconductivity-normal conductivity transition at the critical temperature or critical current density, it is necessary to manufacture a superconducting material having superconducting properties (critical temperature, critical current density, etc.) suitable for the use conditions. The superconducting properties of an oxide superconducting material can be controlled by controlling the crystal grain size or the impurity content thereof. Since control of the crystal grain diameter requires the material to have a uniform crystal grain diameter throughout the entire volume thereof, the silver-sheathed wire material or the tape material having only one of the opposite surfaces thereof covered with silver is extremely difficult to uniformize in crystal grain diameter. None of the attempts made so far has succeeded in attaining this uniformization. The melting-slow cooling-crystallizing method relies on numerous production parameters to control impurity content and crystal grain diameter, such as melting temperature, melting time and slow cooling speed. To attain arbitrary control of impurity content and crystal grain diameter by this method, therefore, a very complicated and difficult procedure has to be adopted.

A need is therefore felt for the development of a method for the production of an oxide superconducting tape material that exhibits excellent superconducting properties appropriate for specific applications.

The present inventors pursued a study with a view to developing a method of production which answers the demand. This invention was accomplished as a results.

SUMMARY OF THE INVENTION

Specifically, this invention relates to a method for the production of an oxide superconducting tape material having a composition of $Bi_2Sr_2CaCu_2O_8$, which method consists essentially of forming a sandwich structure comprising a layer formed of a superconducting powder consisting essentially of Bi, Sr, Ca, Cu, and O and having an essential structure of $Bi_2Sr_2CaCu_2O_8$ and silver sheet layers, the superconducting powder layer being interposed between the silver sheet layers, heating the sandwich structure at a temperature in the range of 810°–910° C. in an atmosphere consisting of oxygen and an inert gas and having an oxygen partial pressure in the range of 0–90%, thereby melting the superconducting powder layer, and then elevating the oxygen partial pressure of the atmosphere while retaining the same heating temperature, thereby crystallizing the molten superconducting powder layer.

Optionally, a plurality of such sandwich structures may be superimposed.

Further, in this invention, the oxide superconducting tape material produced can be imparted with desired properties by adjusting the heating temperature for melting the superconducting powder layer and the time for which this heating temperature is retained, thereby controlling the diameter of the crystal grains formed by the crystallization of the molten layer and/or controlling the occurrence of impurity.

DESCRIPTION OF THE PREFERRED EMBODIMENTS

Figure 1A:
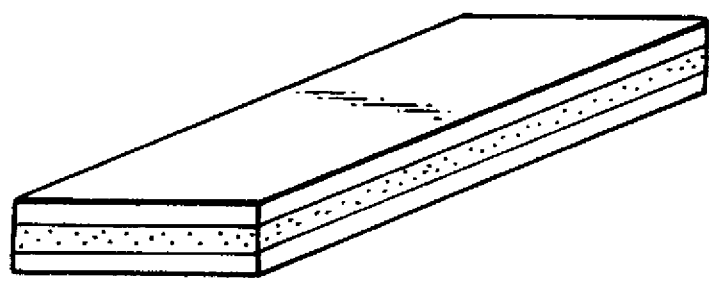
FIGS. 1(A) and 1(B) are perspective views of an oxide superconducting tape material produced by the method of this invention; (A) using one superconducting layer and (B) using four superconducting layers.

The method of this invention enables the superconducting properties of an oxide superconducting substance to be controlled over wide ranges. Specifically, the critical current density can be controlled in the approximate range of $10^5$–$10^2$ A/cm$^2$ and the critical temperature in the approximate range of 77–90 K.

This invention allows the superconducting properties to be controlled over wide ranges from very high levels to low levels and, therefore, permits easy production of oxide superconducting tape materials with superconducting properties required for practical applications in various fields.

The method of this invention for the production of a superconducting tape makes use of the fact that the melting point of an oxide superconducting substance rises with increasing oxygen partial pressure of the atmosphere in which the melting is conducted. This method of production comprises melting the oxide superconducting substance at a prescribed temperature and then controlling (raising) the oxygen partial pressure of the atmosphere while retaining this molten substance at the prescribed temperature thereby crystallizing the molten substance.

The method for producing a superconducting raw material powder to be used for the production of the superconducting tape material, the method for producing the superconducting tape material according to this invention, and the superconducting tape material consequently obtained will now be described in detail.

I. Method for production of superconducting raw material powder

The superconducting powder used as the raw material in the production of the superconducting tape material is obtained by mixing raw material substances in amounts calculated to result in an atomic composition ratio of Sr=0.90–1.20, Ca=0.35–0.60, and Cu=0.9–1.20 based on Bi=1.00, firing the resultant mixture, and pulverizing the fired mixture. This method for the production of the superconducting powder itself is known to the art.

The atomic composition ratio of the raw material substance is only required to form the superconducting crystals of the structure of $Bi_2Sr_2CaCu_2O_8$. It is not particularly limited so long as the ratios of the constituent elements fall in the ranges mentioned above. One example is Bi=1.00, Sr=1.20, Ca=0.35, and Cu=1.00. The firing temperature and the firing time are not particularly limited but are only required to produce the superconducting crystals of the structure of $Bi_2Sr_2CaCu_2O_8$ in a single phase. Generally, they are respectively in the approximate range of 800°–870° C. and in the approximate range of 20–60 hours. For example, the firing is performed at about 800° C. for about 10 hours and then at about 850° C. for about 24 hours. The raw material substances for the production of the superconducting raw material powder are not particularly limited but are only required to form oxides when fired. Elemental metals, oxides, and various compounds (such as carbonates) may be used. Compounds containing two or more kinds of the atoms mentioned above may be used. The means for firing the raw material substances is not particularly limited. It may be arbitrarily selected from among various known means such as electric furnaces and gas furnaces.

II. Method for production of superconducting tape material

Figure 2:
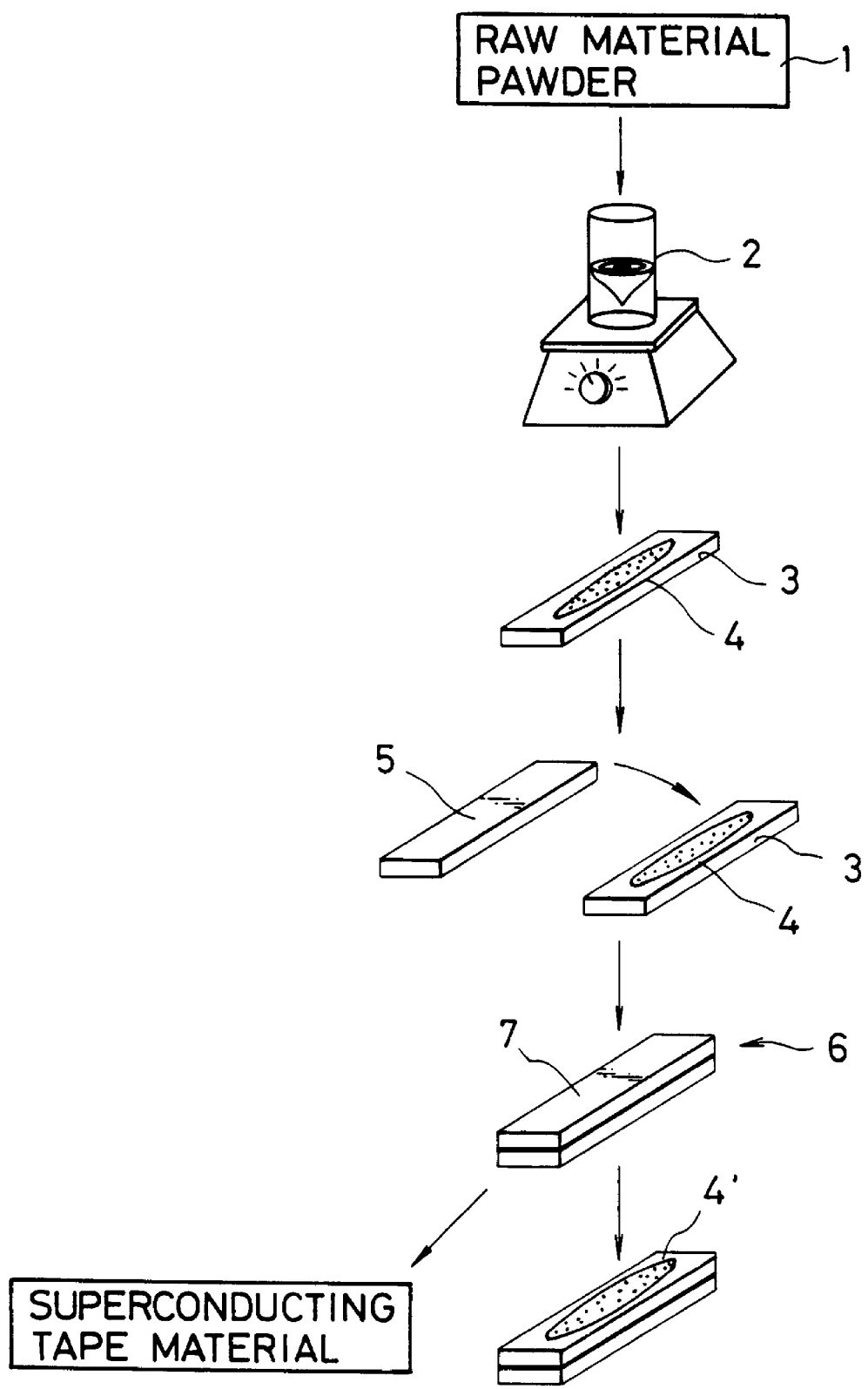
FIG. 2 is a flow chart showing one example of the method of this invention.
Figure 3:
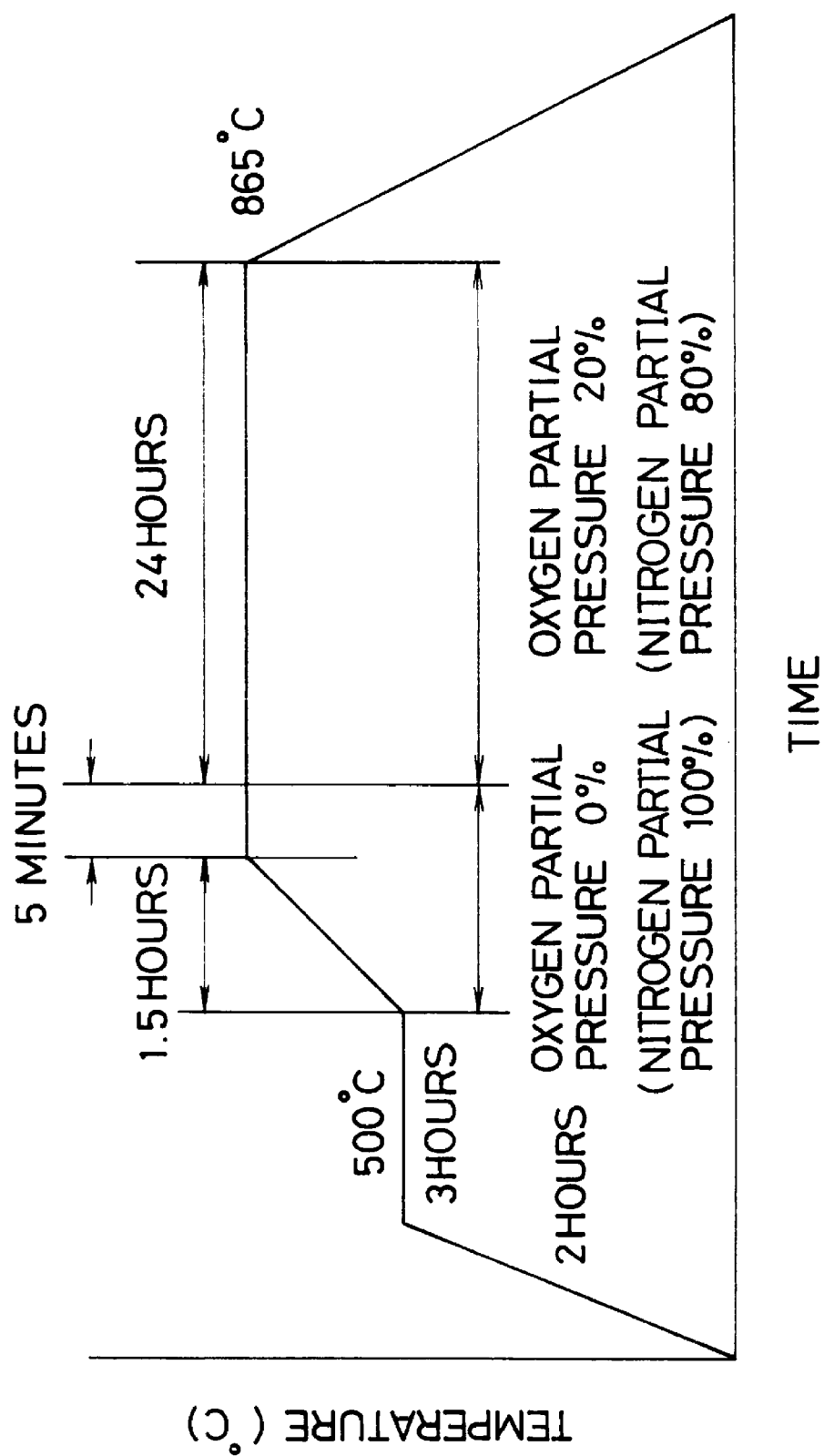
FIG. 3 is a diagram showing a firing pattern of a formed article, namely a sandwich structure, in the method of this invention.

A flow chart depicting one example of the method of this invention for the production of a superconducting tape is shown in FIG. 2 and one example of the production pattern in FIG. 3.

First, the method of production will be described below with reference to FIG. 2.

A superconducting raw material powder 1 of the structure of $Bi_2Sr_2CaCu_2O_8$ obtained by the method described above is placed in a container 2 holding an organic solvent to form a suspension of the powder. Then, the suspension is applied to a silver sheet 3 and the applied layer 4 of the suspension is preliminarily dried to give rise to a coated article. Subsequently, another silver sheet 5 is superimposed on the dried article (superconducting raw material powder) and pressed until the dried article assumes a uniform thickness. This pressing produces a shaped article 6 of a sandwich structure.

The organic solvent used is not particularly limited but is only required to avoid reacting with the superconducting powder. Specific examples of the organic include solvent, ethyl alcohol, α-terpineol, toluene, and hexane. A mixture of two or more such organic solvents may be used. A mixture consisting of ethyl alcohol and α-terpineol at a voluminal ratio of 1:1 may be cited as one example.

An oxide superconducting tape material 8 having one layer of a superconducting substance is obtained by treating the shaped article under the conditions which will be described herein below.

Since the length, width, thickness, and shape of the silver sheet to be used as the substrate is not particularly limited, the superconducting tape material can be produced in arbitrary size and shape. Instead of only one layer of a superconducting substance, a plurality of superconducting substance layer can be superimposed alternately with silver sheet layers, specifically n (n≧3) silver sheet layers and (n−1) superconducting substance layer may be alternately superposed, to give rise to a silver-superconducting substance sandwich structure. The superconducting raw material powder must be directly exposed to the open air at all the faces (lateral faces) of the sandwich structure which are perpendicular to the surfaces of the superposed layers.

A tape material having a plurality of layers of a superconducting substance can be easily produced by applying a suspension 4' of a superconducting raw material powder in the same manner as described above to the surface 7 of a silver sheet of the shaped article 6 as illustrated in FIG. 2 and then treating the applied layer of the suspension by the method described above.

Figure 1B:
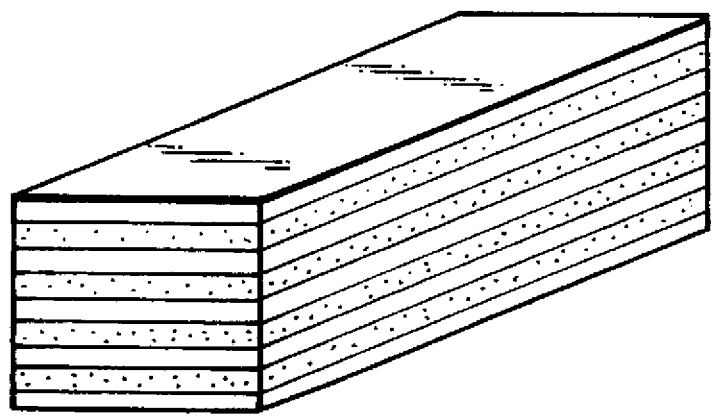

FIG. 1 illustrates superconducting tape materials produced by the method of this invention, (A) having one layer and (B) four layers of a superconducting substance. In this diagram, the white parts represents layers of silver sheet and the black parts layers of a superconducting substance. For example, the silver sheet measures 150 μm in thickness, 20 mm in length, and 2.0 mm in width. The superconducting layers each have a thickness in the range of 10–100 μm.

The method for producing an oxide superconducting substance having a structure of $Bi_2Sr_2CaCu_2O_8$ from the shaped article of the sandwich structure will be described below.

Specifically, the shaped article mentioned above is heated at 300°–500° C. for 1–5 hours to remove the organic solvent completely. Next, the superconducting raw material powder is melted at a temperature in the approximate range of 810°–910° C. at a relatively low oxygen partial pressure (0–90%) for 5–60 minutes and the resultant molten material is kept at the same temperature as used during the melting treatment, with the atmosphere converted to a higher oxygen partial pressure (5–100%), for 3–60 hours to give rise to superconducting crystal grains. The inner pressure of the furnace during the melting treatment and during the continued heating treatment is not particularly limited. It does not need to be increased or decreased but may be constant. The atmosphere in the furnace must be a mixture of oxygen with another gas for the purpose of retaining the inner pressure of the furnace at a prescribed level (such as, for example, one atmosphere). The gas other than oxygen is not particularly limited but is required to be incapable of reacting with the superconducting substance and the silver sheet. Nitrogen gas or a rare gas, for example, may be used. The production is effected, for example, by heating the shaped article in air at 500° C. for 3 hours to remove the organic solvent completely, then melting it at 865° C. under an oxygen partial pressure of 0% (nitrogen partial pressure of 100%) for 5 minutes, and subsequently retaining it at 865° C. for 24 hours, with the atmosphere converted to an oxygen partial pressure of 20% (nitrogen partial pressure of 80%).

FIG. 3 illustrates one example of specific changes in the heating temperature, heating time, and heating atmosphere of the shaped article mentioned above.

The heating means is not particularly limited. It may be any of the known heating means such as, for example, electric furnaces and gas furnaces.

The properties of the oxide superconducting tape material of a structure of $Bi_2Sr_2CaCu_2O_8$ produced by the method of this invention will be described below with reference to working examples which will be set out herein below.

Figure 4:
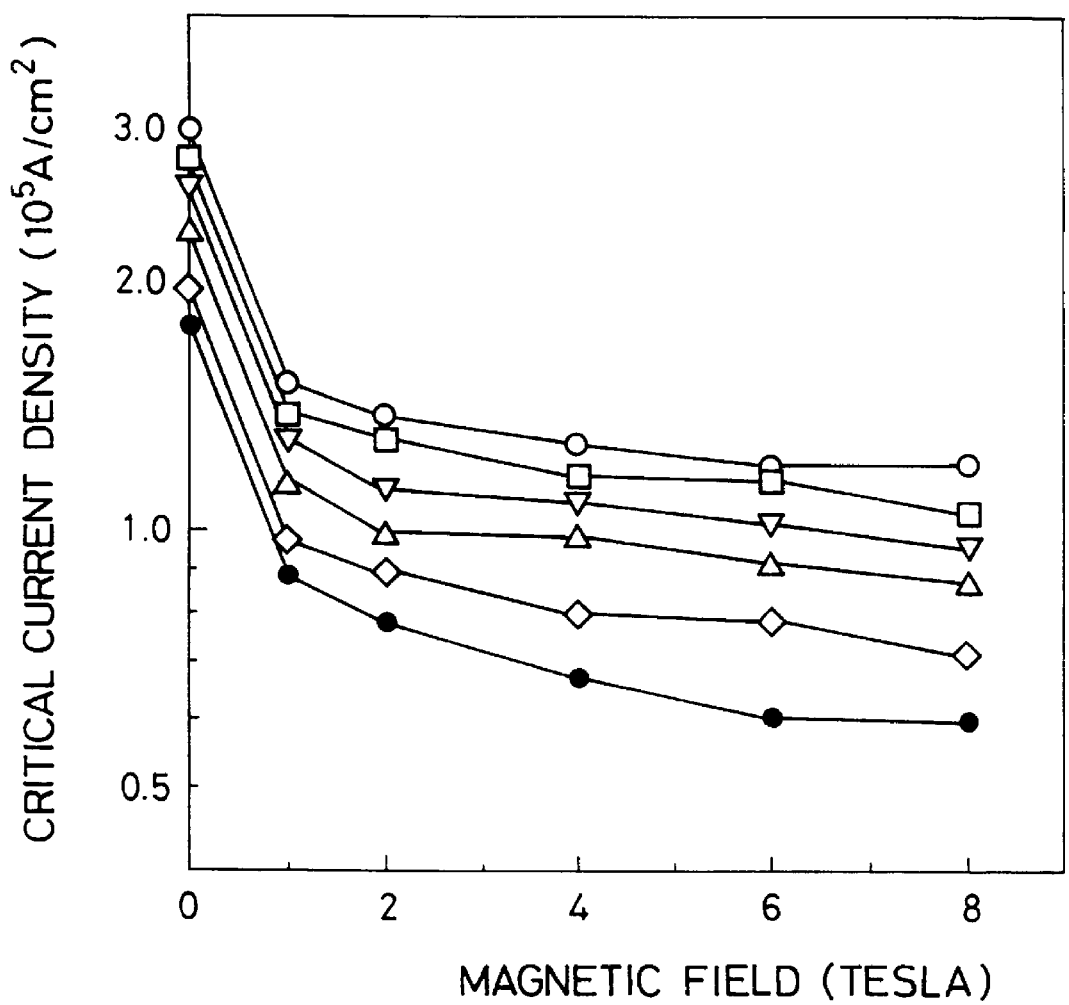
FIG. 4 is a graph showing the relation between the critical current density and the magnetic field at 4.2 K, obtained of the oxide superconducting tape materials produced in Examples 1–6.

FIG. 4 shows the relation between the critical current density and the magnetic field in liquid helium (4.2 K), obtained of the superconducting tape materials produced in Examples 1–6.

In this graph, the marks, ○, □, ▽, Δ, ◇, and ●, represent the data of Examples 1, 2, 3, 4, 5, and 6. The firing times for all the samples were 24 hours. The data indicate that the critical current density increased in accordance as the firing temperature rose. Particularly, the sample obtained at a firing temperature of 865° C. (Example 1) showed very high magnitudes of critical current density, $3.0 \times 10^5$ A/cm$^2$ in a zero magnetic field and $1.0 \times 10^5$ A/cm$^2$ in a high magnetic field of 8 teslas. These magnitudes are high enough to allow the sample to be applied satisfactorily to superconducting magnets for generation of high magnetic fields and to superconducting leads. This sample showed a high critical current density exceeding $10^4$ A/cm$^2$ even at a zero magnetic field at the temperature of liquid nitrogen (77 K). This magnitude is high enough to allow the sample to be applied to superconducting cables to be used in a zero magnetic field.

Figure 5A:
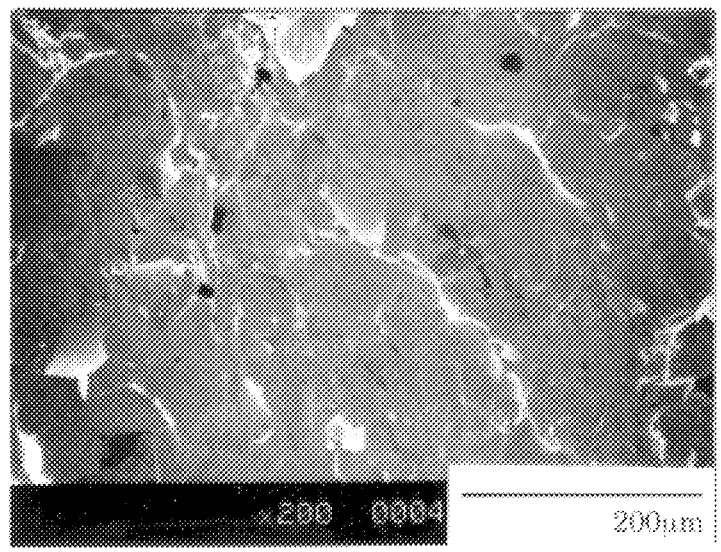
FIGS. 5(A) and (B) are scanning electron micrographs of the crystals of molten superconducting powder layers in the oxide superconducting tape materials obtained respectively in Example 1 and Example 6.
Figure 5B:
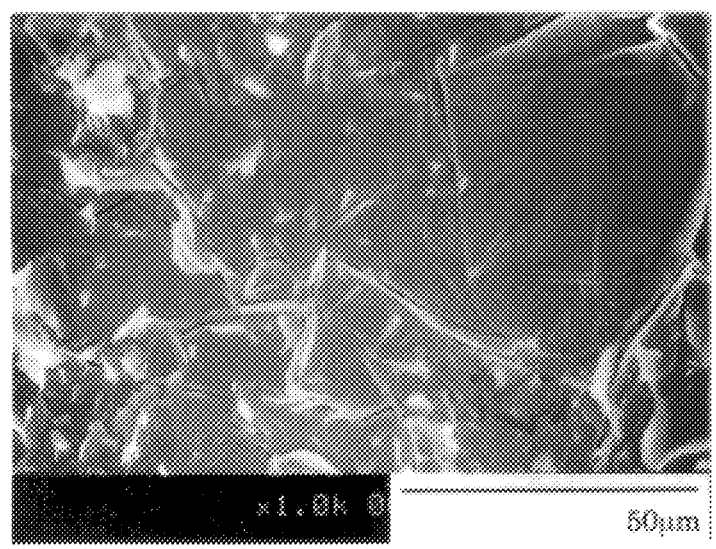

The critical current density of the tape material varies with the firing temperature. This variation is due to the difference in the crystal grain diameter in the superconducting tape material. The scanning electron micrographs (SEM) of the crystals of molten superconducting powder layers in the superconducting tape materials obtained respectively in Example 1 and Example 6 of this invention are shown respectively in FIGS. 5(A) and (B). While the sample fired at 865° C. (Example 1) had a crystal grain diameter of about 300 μm, the sample fired at 830° C. (Example 6) had a crystal gain diameter of about 50 μm.

Figure 6:
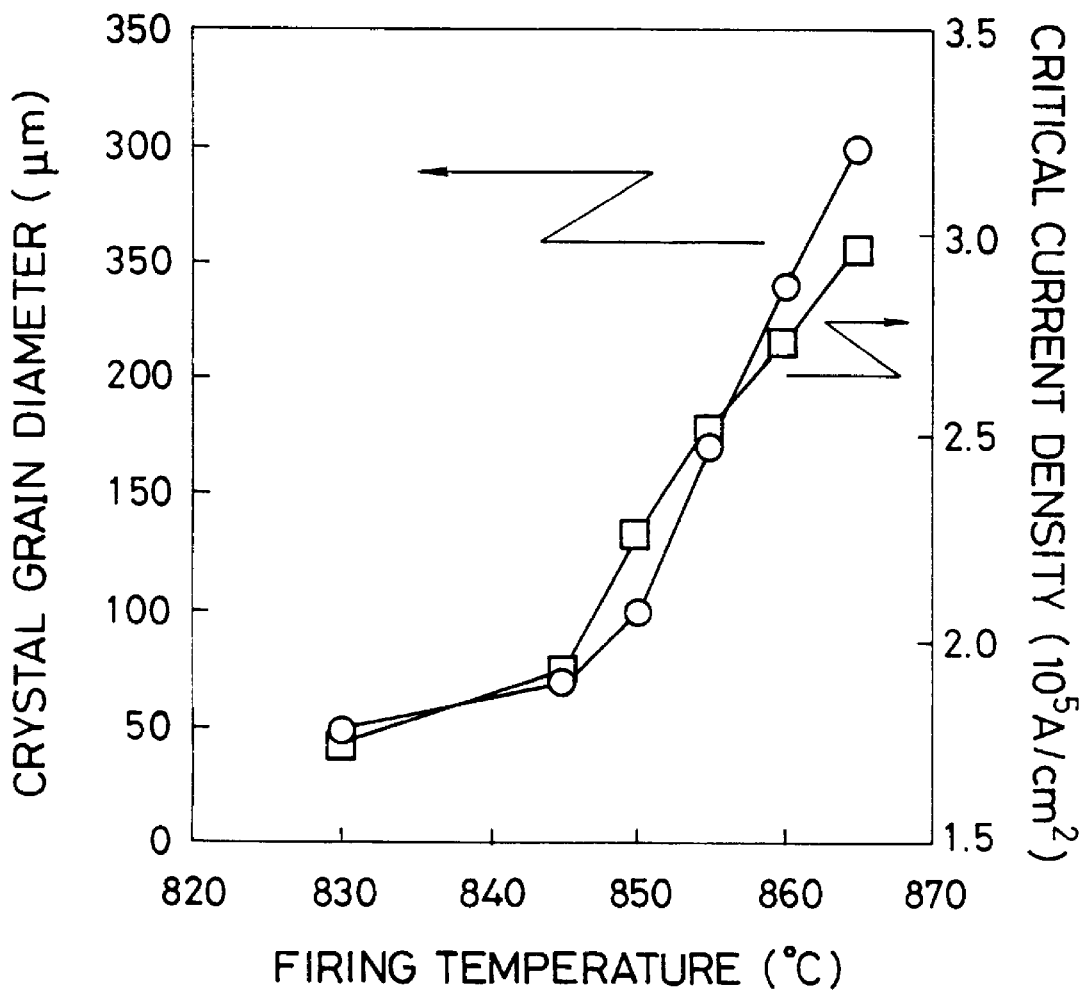
FIG. 6 is a graph showing the relation among the firing temperature, the diameter of crystals of the molten superconducting powder layer of the oxide superconducting tape material, and the critical current density in a zero magnetic field at 4.2 K, obtained respectively of the formed articles in Examples 1–6.

FIG. 6 is a graph showing the relation among the 24-hour firing temperature, the crystal grain diameter, and the critical current density in a zero magnetic field at 4.2 K, obtained of the shaped articles of Examples 1–6. In this graph, the open circles represent the relation between the crystal grain diameter and the firing temperature and the open squares the relation between the critical current density and the firing temperature.

This graph indicates that the superconducting crystal grain diameter decreased with decreasing firing temperature of the sample. The data clearly show that in the method of this invention, the crystal grain diameter in the superconducting tape can be arbitrarily controlled over a wide range of several tens—several hundreds μm and consequently the critical current density can be controlled by simply varying only the firing temperature.

Figure 7:
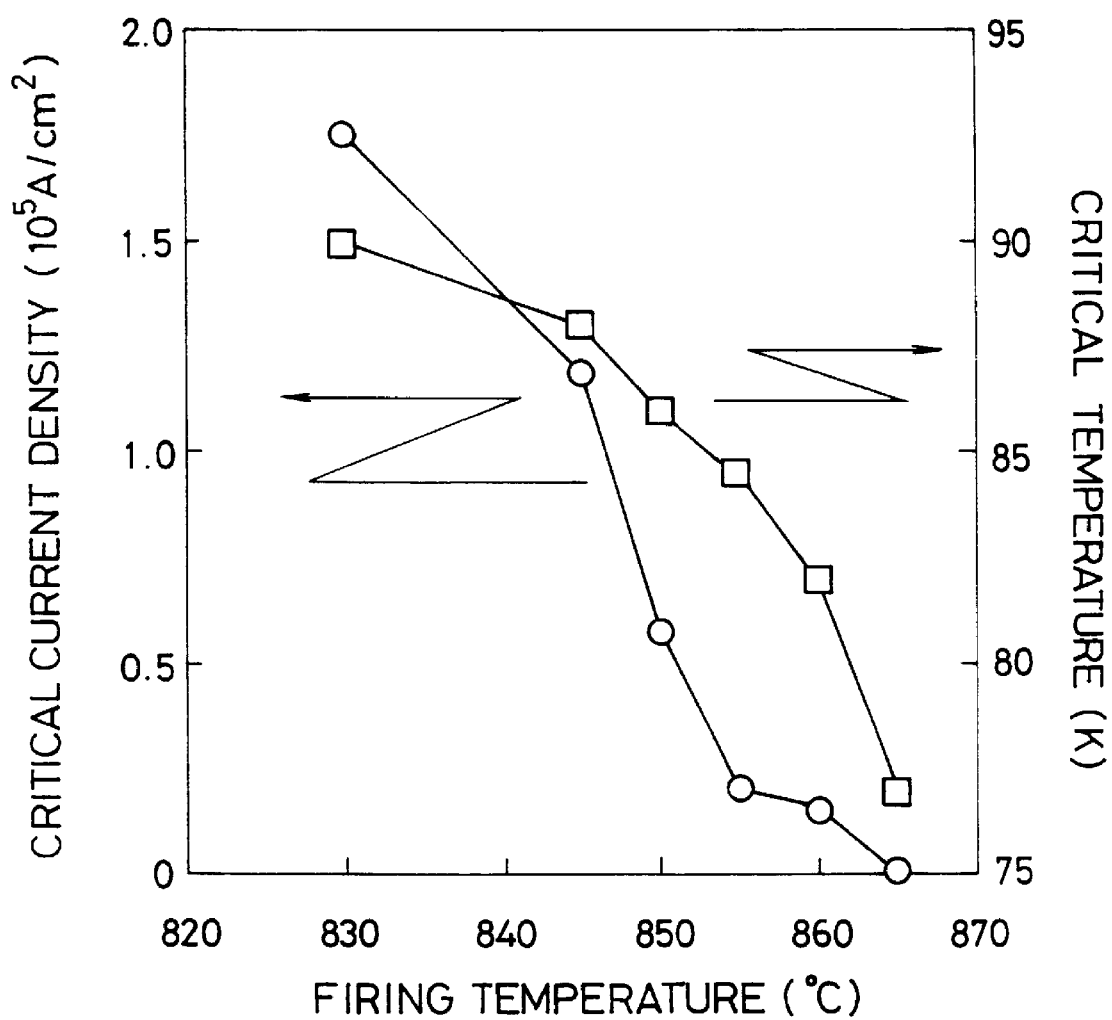
FIG. 7 is a graph showing the relation between the firing temperature and the critical current density in a zero magnetic field at 4.2 K, obtained respectively of the oxide superconducting tape materials in Examples 7–12.

FIG. 7 is a graph showing the relation among the firing temperature of the superconducting tape material used when the crystallizing time of the molten superconducting powder layer was set at 6 hours, the critical current density in a zero magnetic field at 4.2 K, and the critical temperature, obtained in Examples 7–12. In this graph, the open circles represent the relation between the critical current density and the firing temperature and the open squares the relation between the critical temperature and the firing temperature.

The data indicate that the critical current density decreased with increasing firing temperature. It was confirmed by the SEM observation and the X-ray diffraction analysis that the various relations mentioned above had a bearing on the impurity content in the superconducting tape material.

Figure 8A:
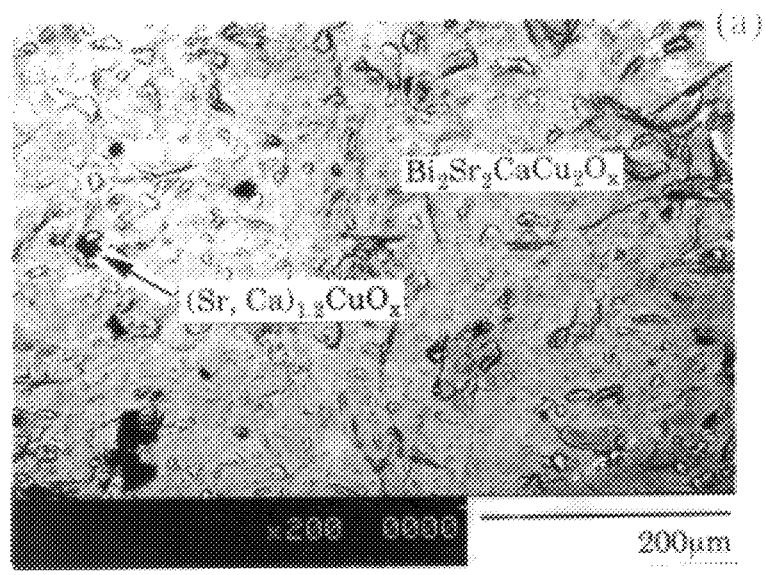
FIGS. 8(A) and (B) are SEM-grade reflection electron image photographs of the crystals of molten superconducting powder layers in the oxide superconducting tape materials obtained respectively in Example 12 and Example 8.
Figure 8B:
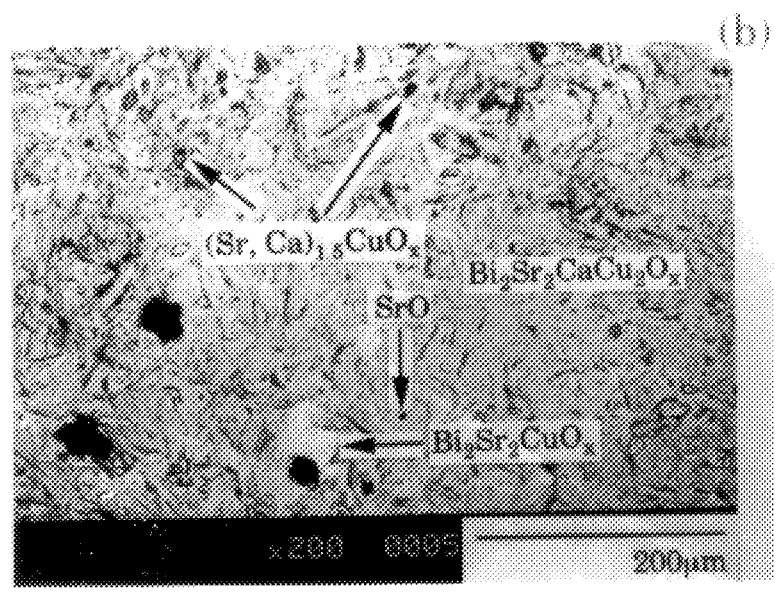

FIGS. 8(A) and (B) are SEM-grade back scattering electron image photographs of the molten superconducting powder crystals of the superconducting tape materials produced respectively in Example 12 and Example 8. The electron micrographs clearly show that the contrast varied with the atomic composition of the crystal grains. The samples were assayed for composition with the characteristic X-ray analytical device annexed to the SEM. In the two samples shown in FIG. 8, wide white areas reflected the $Bi_2Sr_2CaCu_2O_8$ phase of the superconducting crystals and large black areas reflected the empty holes produced when the silver sheet was separated from the superconducting layer. In the sample fired at 830° C., a $(Sr,Ca)_{1.2}CuO_x$ phase, i.e. a solid phase occurring during the melting treatment, was observed very slightly while an impurity phase was observed sparingly [FIG. 8(A)]. It is clear that the number of crystal grains in the impurity phase was increased by the elevation of the firing temperature. In the sample fired at 860° C., a $Bi_2Sr_2CuO_x$ phase, i.e. a liquid phase apparently formed during the melting treatment, was observed in addition of the impurity phase mentioned above [FIG. 8(B)]. It is clear that the amount of impurity persisting as unaltered raw material was increased by the elevation of the firing temperature. The same results were obtained by the X-ray analysis.

Figure 9:
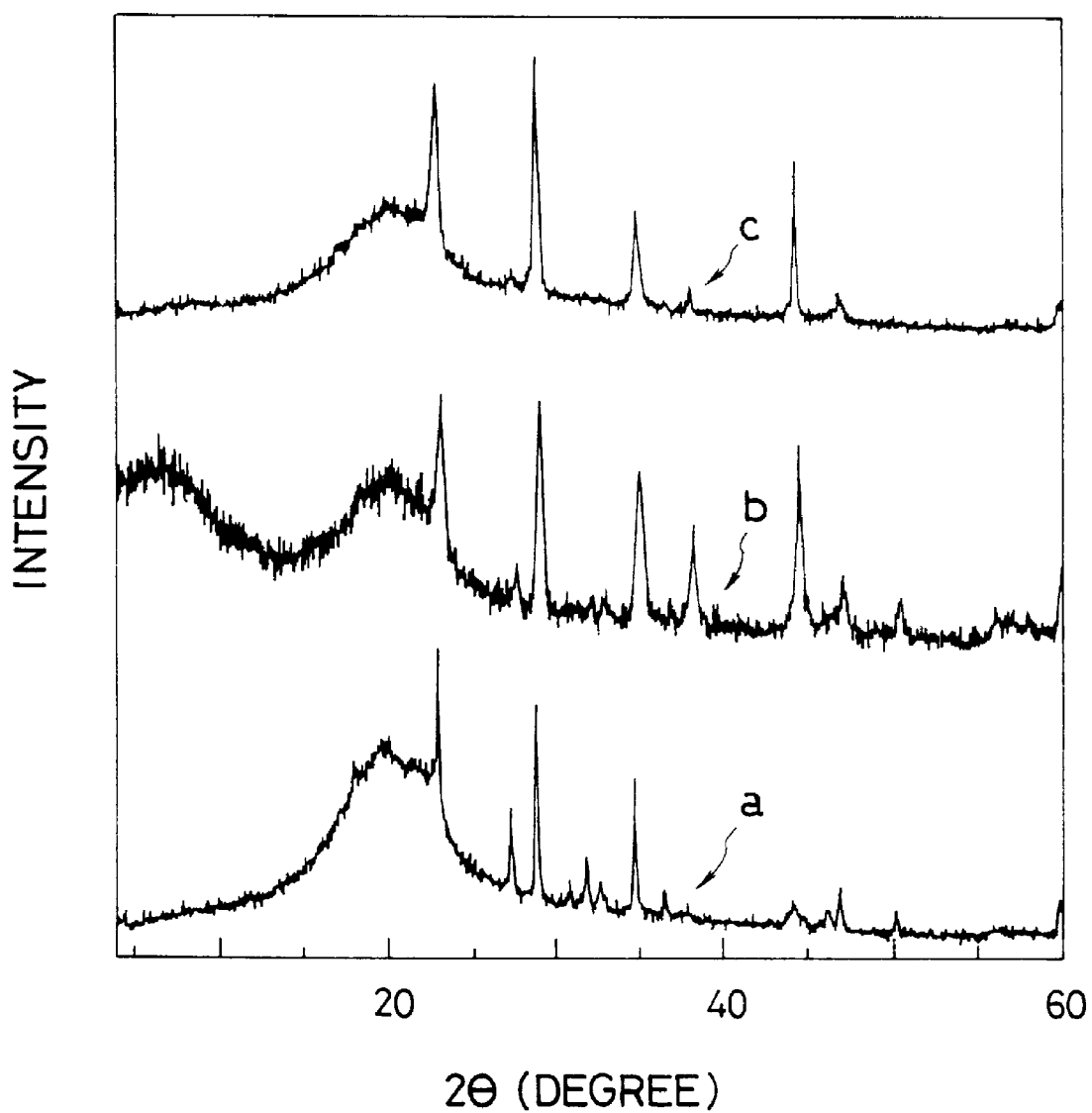
FIG. 9 is a graph showing the X-ray diffraction patterns of the tape materials obtained respectively in Examples 10–12.

FIG. 9 shows X-ray diffraction patterns of the tape materials obtained in Examples 10, 11, and 12. This diagram indicates that the diffraction peak of the $Bi_2Sr_2CuO_x$ phase gained in intensity with increasing firing temperature.

In FIG. 9, the full circles represent the $Bi_2Sr_2CuO_x$ phase and (a), (b), and (c) represent the diffraction patterns of the samples obtained in Example 10, 11, and 12.

In the method of this invention, the superconducting properties can be controlled by the firing time.

Figure 10:
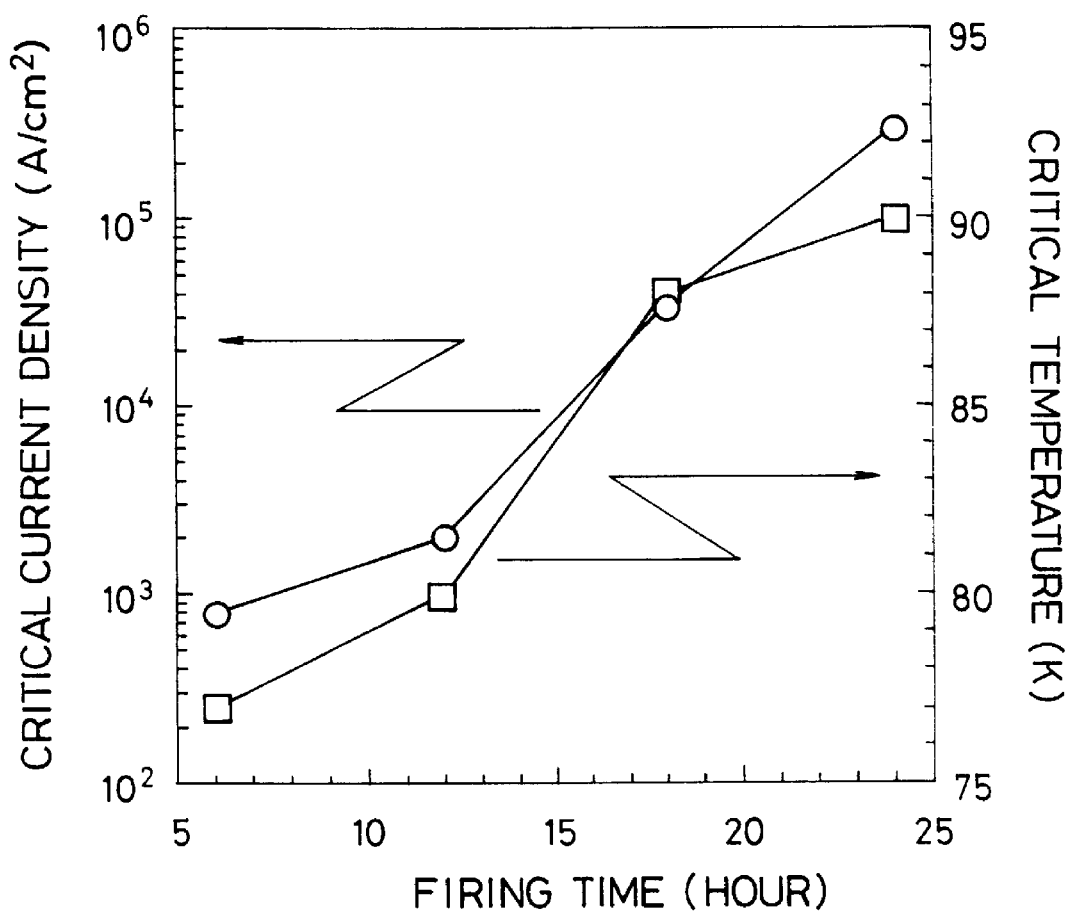
FIG. 10 is a graph showing the relation among the firing time, the critical current density in a zero magnetic field at 4.2 K, and the critical temperature, obtained of the superconducting tape materials in Examples 1, 7, 13, and 14.

FIG. 10 is a graph showing the critical current density and the critical temperature, obtained of the superconducting tape materials manufactured in Examples 1, 7, 13, and 14, with the firing temperature fixed at 865° C. and the firing time varied in the range of 6–24 hours. In this graph, the open circles represent the critical current density and the open squares the critical temperature.

It is clear that the critical current density and the critical temperature increased with increasing firing time. This is because the reaction between the solid phase and the liquid phase which occurred during the melting treatment proceeded and the amount of impurity decreased in proportion as the firing time was longer. The data indicate that in this invention, the critical current density can be controlled over a wide range ($10^5$–$10^2$ A/cm$^2$) by the control of the firing time.

When the melting and firing conditions contemplated by this invention are applied to the conventional tape material having all the surfaces enclosed with a silver sheath or having only one of the opposite surfaces covered with silver, it is very difficult either to obtain very high superconducting properties or to control the superconducting properties. When a tape material having the sandwich structure of this invention is treated by the conventional melting-slow cooling-crystallizing method, it is difficult to control the superconducting properties with such precision over such a wide range as can be achieved by the present invention. This is because the optimization of such production conditions as the firing temperature, the melting time, and the slow cooling speed is complicated.

In contrast, the present invention enables control of the superconducting properties over a wide range because the control of crystal grain diameter and the control of impurity content can be realized with high precision by preparing a shaped article in a sandwich structure having a superconducting substance and a silver sheet alternately superposed (thereby giving rise to at least one layer of the superconducting substance) and having the raw material powder exposed to the ambient air at all the surfaces (lateral surfaces) of the structure perpendicular to the opposite surfaces of the superposed layers and melting and crystallizing this shaped article while controlling the oxygen partial pressure of the atmosphere under a prescribed temperature condition.

The method of this invention, in producing a superconducting tape material, enables the crystal grain diameter and/or the impurity content to be controlled by controlling the firing temperature and/or the firing time and allows the superconducting properties to be easily controlled over a wide range.

Specifically, the method of this invention allows easy manufacture of a superconducting tape material which has a critical current density within a wide range of $10^5$–$10^2$ A/cm$^2$ and a critical temperature within a wide range of 77–90 K.

The method of this invention therefore expands the range of applications of the oxide superconducting substance to the extent of covering current leads for power transmission, superconducting cables for power transmission, superconducting switches, superconducting fuses, and superconducting sensors, as well as superconducting magnets for the generation of magnetic fields.

Embodiment

The features of the present invention will be described more specifically below with reference to working examples.

EXAMPLE 1

The method of this invention was conducted using the procedure shown in FIG. 2 in accordance with the firing pattern illustrated in FIG. 3.

The starting raw materials prepared in amounts calculated to result in an atomic composition of Sr=1.20, Ca=0.35, and Cu=1.00, based on Bi=1.00 were thoroughly mixed. The resultant mixture was placed in an alumina crucible, fired in an electric furnace at 800° C. for 10 hours, pulverized, press formed, and then fired at 850° C. for 24 hours. Then, the resultant sinter was thoroughly pulverized to manufacture a superconducting raw material powder having a structure of $Bi_2Sr_2CaCu_2O_8$.

Subsequently, this superconducting raw material powder was suspended in a mixed solvent consisting of ethyl alcohol and α-terpineol at a voluminal ratio of 1:1. The suspension was applied to a silver sheet, 20 mm in length, 2.0 mm in width, and 150 μm in thickness, and dried to expel the mixed solvent by evaporation. Another silver sheet of the same size was superimposed on the superconducting powder layer and the superimposed layers were lightly pressed to afford a shaped article.

The produced shaped article was heated at 500° C. for three hours to remove the organic solvent completely, subsequently heated at 865° C. at an oxygen partial pressure of 0% (nitrogen partial pressure of 100%) for five minutes to melt the superconducting raw material powder, and thereafter fired at the same temperature, with the atmosphere converted to an oxygen partial pressure of 20% (nitrogen partial pressure 80%), for 24 hours.

The superconducting tape material consequently obtained measured 20 mm in length, 2.0 mm in width, and 18 μm in thickness of the superconducting substance layer (one layer).

The raw materials for the superconducting substance used in this example and in the following examples were as follows.

Bi source: Bismuth oxide ($Bi_2O_3$)
Sr source: Strontium carbonate ($SrCO_3$)
Ca source: Calcium carbonate ($CaCO_3$)
Cu source: Copper oxide (CuO)

EXAMPLES 2–25

Superconducting tapes according to this invention were produced by following the procedure of Example 1 while changing the number of layers of superconducting substance, the firing temperature, the firing time, and the oxygen partial pressure as shown in Table 1. The conditions for Example 1 are additionally shown in Table 1.

TABLE 1

| Example No. | Firing Temperature (°C.) | Firing time (hours) | Oxygen partial pressure (%) during melting treatment | Oxygen partial pressure (%) during crystallizing treatment |
|---|---|---|---|---|
| 1 | 865 | 24 | 0 | 20 |
| 2 | 860 | 24 | 0 | 20 |
| 3 | 855 | 24 | 0 | 20 |
| 4 | 850 | 24 | 0 | 20 |
| 5 | 845 | 24 | 0 | 20 |
| 6 | 830 | 24 | 0 | 20 |
| 7 | 865 | 6 | 0 | 20 |
| 8 | 860 | 6 | 0 | 20 |
| 9 | 855 | 6 | 0 | 20 |
| 10 | 850 | 6 | 0 | 20 |
| 11 | 845 | 6 | 0 | 20 |
| 12 | 830 | 6 | 0 | 20 |
| 13 | 865 | 12 | 0 | 20 |
| 14 | 865 | 18 | 0 | 20 |
| 15 | 855 | 6 | 0 | 5 |
| 16 | 855 | 24 | 0 | 5 |
| 17 | 885 | 24 | 20 | 80 |
| 18 | 885 | 48 | 20 | 80 |
| 19 | 895 | 24 | 50 | 100 |
| 20 | 895 | 48 | 50 | 100 |
| 21 | 900 | 24 | 90 | 100 |
| 22 | 900 | 48 | 90 | 100 |
| 23 | 865 | 24 | 0 | 20 |
| 24 | 895 | 24 | 50 | 100 |
| 25 | 900 | 48 | 90 | 100 |

The number of layers of the superconducting substance was one in Examples 1–22 and 4 in Examples 23–25. In Examples 23–25, therefore, the series of operations of applying the suspension of the superconducting raw material powder, drying the applied layer of the suspension, and superimposing the silver sheet was repeated four times and then the melting and the firing of the raw material powder were performed.

What is claimed is:

1. A method for the production of an oxide superconducting tape material having a composition of $Bi_2Sr_2CaCu_2O_8$, which method consists essentially of forming a sandwich structure comprising a layer formed of a superconducting powder consisting essentially of Bi, Sr, Ca, Cu, and O and having an essential structure of $Bi_2Sr_2CaCu_2O_8$ and silver sheet layers, said superconducting powder layer being interposed between said silver sheet layers, heating said sandwich structure at a temperature in the range of 810°–910° C. in an atmosphere consisting of oxygen and an inert gas and having an oxygen partial pressure in the range of 0–90%, thereby melting said superconducting powder layer, and then elevating the oxygen partial pressure of said atmosphere at least 5% while retaining the heating temperature at said temperature, thereby crystallizing the molten superconducting powder layer.

2. A method according to claim 1, wherein said sandwich structure has a plurality of layers of said superconducting power superimposed alternately with layers of silver sheet.

3. A method according to claim 1, wherein said layers of superconducting substance obtained by crystallizing the molten superconducting powder layer each has a thickness in the range of 10–100 μm.

4. A method according to claim 1, wherein the diameter of crystal grains formed during the crystallization of the molten layer and the occurrence of impurity therein are controlled by adjusting the heating temperature for melting the layer of said superconducting powder and the period for which said heating temperature is retained.

* * * * *